US006990870B2

(12) United States Patent
Choi et al.

(10) Patent No.: US 6,990,870 B2
(45) Date of Patent: Jan. 31, 2006

(54) SYSTEM FOR DETERMINING CHARACTERISTICS OF SUBSTRATES EMPLOYING FLUID GEOMETRIES

(75) Inventors: Byung J. Choi, Round Rock, TX (US); Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 45 days.

(21) Appl. No.: 10/923,628

(22) Filed: Aug. 20, 2004

(65) Prior Publication Data

US 2005/0028618 A1 Feb. 10, 2005

Related U.S. Application Data

(62) Division of application No. 10/318,365, filed on Dec. 12, 2002, now Pat. No. 6,871,558, which is a division of application No. 10/863,800, filed on Jun. 8, 2004.

(51) Int. Cl.
*G01N 19/00* (2006.01)

(52) U.S. Cl. .................................. 73/865.9
(58) Field of Classification Search ............. 73/105, 73/149, 432.1, 868.9, 865.8, 865.9
See application file for complete search history.

(56) References Cited

U.S. PATENT DOCUMENTS

| | | | |
|---|---|---|---|
| 3,527,062 A | 9/1970 | Belinski et al. | 464/78 |
| 3,807,027 A | 4/1974 | Heisler | 29/423 |
| 3,807,029 A | 4/1974 | Troeger | 29/436 |
| 3,811,665 A | 5/1974 | Seelig | 267/160 |
| 4,062,600 A | 12/1977 | Wyse | 384/205 |
| 4,098,001 A | 7/1978 | Watson | 33/644 |
| 4,155,169 A | 5/1979 | Drake et al. | 33/644 |
| 4,202,107 A | 5/1980 | Watson | 33/644 |
| 4,267,212 A | 5/1981 | Sakawaki | 427/240 |
| 4,326,805 A | 4/1982 | Feldman et al. | 356/399 |
| 4,337,579 A | 7/1982 | De Fazio | 33/644 |
| 4,355,469 A | 10/1982 | Nevins et al. | 267/150 |
| 4,414,750 A | 11/1983 | De Fazio | 267/166 |
| 4,440,804 A | 4/1984 | Milgram | 438/670 |
| 4,451,507 A | 5/1984 | Beltz et al. | 427/240 |
| 4,512,848 A | 4/1985 | Deckman et al. | 216/43 |
| 4,544,572 A | 10/1985 | Sandvig et al. | 427/492 |

(Continued)

FOREIGN PATENT DOCUMENTS

DE 2800476 7/1978

(Continued)

OTHER PUBLICATIONS

Chou, Nanoimprint Lithography and Lithographically Induced Self-Assembly, MRS Bulletin, pp. 512-517, Jul. 1, 2001.

(Continued)

*Primary Examiner*—Hezron Williams
*Assistant Examiner*—Tamiko Bellamy
(74) *Attorney, Agent, or Firm*—Kenneth C. Brooks

(57) ABSTRACT

The present invention provides a technique for determining characteristics of substrates, such as the presence of contaminants, shape, as well as the spatial relationships between spaced-apart substrates. The spatial relationships include distance and angular orientation, between first and second spaced apart substrates. The technique includes forming a volume of fluid on the second substrate, with the volume of fluid having an area associated therewith. The volume of fluid is compressed between the first and second substrates to effectuate a change in properties of the area, defining changed properties. The changed properties are sensed, and the characteristics of the first and second substrates are determined as a function of the changed properties.

19 Claims, 6 Drawing Sheets

U.S. PATENT DOCUMENTS

| | | | |
|---|---|---|---|
| 4,552,832 A | 11/1985 | Blume et al. | 430/320 |
| 4,610,442 A | 9/1986 | Oku et al. | 269/73 |
| 4,694,703 A | 9/1987 | Routson | 74/5 F |
| 4,722,878 A | 2/1988 | Watakabe et al. | 430/5 |
| 4,724,222 A | 2/1988 | Feldman | 250/492.2 |
| 4,731,155 A | 3/1988 | Napoli et al. | 216/44 |
| 4,763,886 A | 8/1988 | Takei | 269/73 |
| 4,772,878 A | 9/1988 | Kane | 340/568.4 |
| 4,846,931 A | 7/1989 | Gmitter et al. | 438/26 |
| 4,848,179 A | 7/1989 | Ubhayakar | 73/490.04 |
| 4,883,561 A | 11/1989 | Gmitter et al. | 438/27 |
| 4,887,283 A | 12/1989 | Hosno | 378/85 |
| 4,909,151 A | 3/1990 | Fukui et al. | 101/450.1 |
| 4,929,083 A | 5/1990 | Brunner | 356/400 |
| 4,959,252 A | 9/1990 | Bonnebat et al. | 428/64.7 |
| 4,964,145 A | 10/1990 | Maldonado | 378/35 |
| 5,028,366 A | 7/1991 | Harakal et al. | 264/51 |
| 5,063,321 A | 11/1991 | Carter | 310/323.17 |
| 5,072,126 A | 12/1991 | Progler | 250/548 |
| 5,073,230 A | 12/1991 | Maracas et al. | 438/458 |
| 5,110,514 A | 5/1992 | Soane | 264/496 |
| 5,126,006 A | 6/1992 | Cronin et al. | 438/702 |
| 5,155,749 A | 10/1992 | DiMilia et al. | 378/35 |
| 5,171,490 A | 12/1992 | Fudim | 264/401 |
| 5,204,739 A | 4/1993 | Domenicali | 348/79 |
| 5,206,983 A | 5/1993 | Guckel et al. | 29/598 |
| 5,218,193 A | 6/1993 | Miyatake | 250/201.4 |
| 5,240,550 A | 8/1993 | Boehnke et al. | 216/54 |
| 5,259,926 A | 11/1993 | Kuwabara et al. | 216/54 |
| 5,270,984 A | 12/1993 | Mine | 367/140 |
| 5,277,749 A | 1/1994 | Griffith et al. | 216/140 |
| 5,348,616 A | 9/1994 | Hartman et al. | 216/48 |
| 5,355,219 A | 10/1994 | Araki et al. | 356/490 |
| 5,357,122 A | 10/1994 | Okubora et al. | 257/84 |
| 5,392,123 A | 2/1995 | Marcus et al. | 356/625 |
| 5,414,514 A | 5/1995 | Smith et al. | 414/403 |
| 5,425,848 A | 6/1995 | Haisma et al. | 216/48 |
| 5,425,964 A | 6/1995 | Southwell et al. | 427/10 |
| 5,452,090 A | 9/1995 | Progler et al. | 356/401 |
| 5,480,047 A | 1/1996 | Tanigawa et al. | 216/12 |
| 5,504,793 A | 4/1996 | Chen | 378/34 |
| 5,507,411 A | 4/1996 | Peckels | 222/1 |
| 5,508,527 A | 4/1996 | Kuroda et al. | 250/491.1 |
| 5,512,131 A | 4/1996 | Kumar et al. | 438/738 |
| 5,515,167 A | 5/1996 | Ledger et al. | 356/505 |
| 5,523,878 A | 6/1996 | Wallace et al. | 359/290 |
| 5,545,367 A | 8/1996 | Bae et al. | 264/401 |
| 5,563,702 A | 10/1996 | Emery et al. | 356/73 |
| 5,566,584 A | 10/1996 | Briganti | 74/490.07 |
| 5,601,641 A | 2/1997 | Stephens | 106/38.25 |
| 5,625,193 A | 4/1997 | Broude et al. | 250/372 |
| 5,633,505 A | 5/1997 | Chung et al. | 250/491.1 |
| 5,669,303 A | 9/1997 | Maracas et al. | 101/327 |
| 5,724,145 A | 3/1998 | Kondo et al. | 356/632 |
| 5,725,788 A | 3/1998 | Maracas et al. | 216/41 |
| 5,726,548 A | 3/1998 | Chiba et al. | 318/611 |
| 5,731,981 A | 3/1998 | Simard | 700/239 |
| 5,747,102 A | 5/1998 | Smith et al. | 427/98.4 |
| 5,753,014 A | 5/1998 | Van Rijn | 96/12 |
| 5,760,500 A | 6/1998 | Kondo et al. | 310/12 |
| 5,772,905 A | 6/1998 | Chou | 216/44 |
| 5,779,799 A | 7/1998 | Davis | 118/663 |
| 5,785,918 A | 7/1998 | Hull | 264/401 |
| 5,802,914 A | 9/1998 | Fassler et al. | 74/110 |
| 5,804,474 A | 9/1998 | Sakaki et al. | 438/167 |
| 5,808,742 A | 9/1998 | Everett et al. | 356/509 |
| 5,825,482 A | 10/1998 | Nikoonahad et al. | 356/237.2 |
| 5,837,892 A * | 11/1998 | Cavallaro et al. | 73/149 |
| 5,849,209 A | 12/1998 | Kindt-Larsen et al. | 249/134 |
| 5,849,222 A | 12/1998 | Jen et al. | 264/2.3 |
| 5,876,550 A | 3/1999 | Feygin et al. | 156/264 |
| 5,877,036 A | 3/1999 | Kawai | 438/116 |
| 5,877,861 A | 3/1999 | Ausschnitt et al. | 356/401 |
| 5,884,292 A | 3/1999 | Baker et al. | 705/403 |
| 5,888,650 A | 3/1999 | Calhoun et al. | 428/354 |
| 5,900,160 A | 5/1999 | Whitesides et al. | 216/41 |
| 5,937,758 A | 8/1999 | Maracas et al. | 101/327 |
| 5,942,871 A | 8/1999 | Lee | 318/611 |
| 5,948,470 A | 9/1999 | Harrison et al. | 427/198 |
| 5,952,127 A | 9/1999 | Yamanaka | 430/5 |
| 5,988,859 A | 11/1999 | Kirk | 700/232 |
| 6,016,696 A * | 1/2000 | Bair et al. | 73/149 |
| 6,036,055 A | 3/2000 | Mogadam et al. | 222/123 |
| 6,038,280 A | 3/2000 | Rossiger et al. | 378/50 |
| 6,046,056 A | 4/2000 | Parce et al. | 204/403.05 |
| 6,051,345 A | 4/2000 | Huang | 430/5 |
| 6,052,183 A | 4/2000 | Lee | 356/337 |
| 6,081,334 A | 6/2000 | Brimbergen et al. | 356/499 |
| 6,088,103 A | 7/2000 | Everett et al. | 356/503 |
| 6,091,485 A | 7/2000 | Li et al. | 356/73 |
| 6,112,588 A * | 9/2000 | Cavallaro et al. | 73/149 |
| 6,117,708 A | 9/2000 | Wensel | 438/118 |
| 6,125,183 A | 9/2000 | Jiawook et al. | 380/28 |
| 6,128,085 A | 10/2000 | Buermann et al. | 356/369 |
| 6,133,576 A | 10/2000 | Shafer et al. | 250/461.1 |
| 6,137,562 A | 10/2000 | Masuyuki et al. | 355/73 |
| 6,143,412 A | 11/2000 | Schueller et al. | 428/408 |
| 6,168,845 B1 | 1/2001 | Fontana, Jr. et al. | 428/65.5 |
| 6,180,239 B1 | 1/2001 | Whitesides et al. | 428/411.1 |
| 6,182,042 B1 | 1/2001 | Peevers | 704/269 |
| 6,188,150 B1 | 2/2001 | Spence | 310/12 |
| 6,204,922 B1 | 3/2001 | Chalmers | 356/630 |
| 6,218,316 B1 | 4/2001 | Marsh | 438/780 |
| 6,234,379 B1 | 5/2001 | Donges | 228/207 |
| 6,245,213 B1 | 6/2001 | Olsson et al. | 205/646 |
| 6,245,581 B1 | 6/2001 | Bonser et al. | 438/8 |
| 6,278,519 B1 | 8/2001 | Rosencwaig et al. | 356/359 |
| 6,297,880 B1 | 10/2001 | Rosencwaig et al. | 356/369 |
| 6,309,580 B1 | 10/2001 | Chou | 264/338 |
| 6,316,290 B1 | 11/2001 | Wensel | 438/118 |
| 6,334,960 B1 | 1/2002 | Willson et al. | 216/52 |
| 6,337,262 B1 | 1/2002 | Pradeep et al. | 438/574 |
| 6,355,198 B1 | 3/2002 | Kim et al. | 264/259 |
| 6,361,831 B1 | 3/2002 | Sato et al. | 427/430 |
| 6,387,787 B1 | 5/2002 | Mancini et al. | 438/586 |
| 6,391,217 B2 | 5/2002 | Schaffer et al. | 216/41 |
| 6,407,340 B1 | 6/2002 | Wikstrom et al. | 174/250 |
| 6,411,010 B1 | 6/2002 | Suzuki et al. | 310/323 |
| 6,420,892 B1 | 7/2002 | Krivy et al. | 324/758 |
| 6,423,207 B1 | 7/2002 | Heidari et al. | 205/655 |
| 6,437,891 B1 | 8/2002 | Chandrasekhar et al. | 398/139 |
| 6,447,919 B1 | 9/2002 | Brown et al. | 428/422 |
| 6,467,761 B1 | 10/2002 | Amatucci et al. | 269/58 |
| 6,482,742 B1 | 11/2002 | Chou | 438/690 |
| 6,495,624 B1 | 12/2002 | Brown | 524/462 |
| 6,517,977 B2 | 2/2003 | Resnick et al. | 430/5 |
| 6,517,995 B1 | 2/2003 | Jacobenson et al. | 430/320 |
| 6,518,168 B1 | 2/2003 | Clem et al. | 438/623 |
| 6,518,189 B1 | 2/2003 | Chou | 438/706 |
| 6,521,324 B1 | 2/2003 | Debe et al. | 156/235 |
| 6,522,411 B1 | 2/2003 | Moon et al. | 356/505 |
| 6,539,286 B1 | 3/2003 | Jiang | 700/282 |
| 6,561,706 B2 | 5/2003 | Singh et al. | 396/611 |
| 6,580,172 B2 | 6/2003 | Mancini et al. | 257/762 |
| 6,580,505 B1 | 6/2003 | Bareket | 356/401 |
| 6,588,632 B1 | 7/2003 | Nicol | 222/639 |
| 6,600,969 B2 | 7/2003 | Sudolcan et al. | 700/237 |
| 6,603,538 B1 | 8/2003 | Oluseyi et al. | 356/72 |
| 6,633,391 B1 | 10/2003 | Oluseyi et al. | 356/630 |
| 6,646,662 B1 | 11/2003 | Nebashi et al. | 346/140.1 |
| 6,696,157 B1 | 2/2004 | David et al. | 428/408 |
| 6,696,220 B2 | 2/2004 | Bailey et al. | 430/272 |
| 6,703,256 B2 | 3/2004 | Nagata et al. | 438/48 |
| 6,713,238 B1 | 3/2004 | Chou et al. | 439/322 |

| | | | |
|---|---|---|---|
| 6,719,915 B2 | 4/2004 | Willson et al. | 216/44 |
| 6,753,972 B1 | 6/2004 | Hirose et al. | |
| 6,776,094 B1 | 8/2004 | Whitesides et al. | 101/327 |
| 6,809,356 B2 | 10/2004 | Chou | 257/225 |
| 6,828,244 B2 | 12/2004 | Chou | 438/706 |
| 6,871,558 B2 | 3/2005 | Choi et al. | 73/865.8 |
| 2001/0023829 A1 | 9/2001 | Olsson et al. | 205/103 |
| 2001/0040145 A1 | 11/2001 | Willson et al. | 216/52 |
| 2002/0042027 A1 | 4/2002 | Chou et al. | 430/322 |
| 2002/0069525 A1 | 6/2002 | Hada et al. | 29/834 |
| 2002/0093122 A1 | 7/2002 | Choi et al. | 264/401 |
| 2002/0094496 A1 | 7/2002 | Choi et al. | 430/322 |
| 2002/0098426 A1 | 7/2002 | Sreenivasan et al. | 430/22 |
| 2002/0132482 A1 | 9/2002 | Chou | 438/692 |
| 2002/0150398 A1 | 10/2002 | Choi | 396/428 |
| 2002/0167117 A1 | 11/2002 | Chou | 264/338 |
| 2002/0177319 A1 | 11/2002 | Chou | 438/690 |
| 2003/0034329 A1 | 2/2003 | Chou | 216/44 |
| 2003/0080471 A1 | 5/2003 | Chou | 264/338 |
| 2003/0092261 A1 | 5/2003 | Kondo et al. | 438/638 |
| 2003/0133126 A1 | 7/2003 | Sarfaty et al. | 356/503 |
| 2003/0179354 A1 | 9/2003 | Araki et al. | 355/53 |
| 2003/0205657 A1 | 11/2003 | Voisin | 249/187.1 |
| 2003/0205658 A1 | 11/2003 | Voisin | 249/187.1 |
| 2003/0215577 A1 | 11/2003 | Willson et al. | 427/458 |
| 2003/0235787 A1 | 12/2003 | Watts et al. | 430/280.1 |
| 2004/0007799 A1 | 1/2004 | Choi et al. | 264/494 |
| 2004/0008334 A1 | 1/2004 | Sreenivasan et al. | 355/72 |
| 2004/0009673 A1 | 1/2004 | Sreenivasan et al. | 438/694 |
| 2004/0010341 A1 | 1/2004 | Watts et al. | 700/240 |
| 2004/0021254 A1 | 2/2004 | Sreenivasan et al. | 264/406 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0038552 A1 | 2/2004 | Watts et al. | 438/759 |
| 2004/0046271 A1 | 3/2004 | Watts | 264/11.25 |
| 2004/0046288 A1 | 3/2004 | Chou | 264/479 |
| 2004/0053146 A1 | 3/2004 | Sreenivasan et al. | 430/22 |
| 2004/0065252 A1 | 4/2004 | Sreenivasan et al. | 117/84 |
| 2004/0065976 A1 | 4/2004 | Sreenivasan et al. | 264/171.1 |
| 2004/0086793 A1 | 5/2004 | Sreenivasan et al. | 430/22 |
| 2004/0089979 A1 | 5/2004 | Rubin | 264/293 |
| 2004/0090611 A1 | 5/2004 | Choi et al. | 355/75 |
| 2004/0104641 A1 | 6/2004 | Choi et al. | 310/328 |
| 2004/0110856 A1 | 6/2004 | Young et al. | 522/6 |
| 2004/0112153 A1 | 6/2004 | Choi et al. | 73/865.9 |
| 2004/0112861 A1 | 6/2004 | Choi et al. | 216/66 |
| 2004/0112862 A1 | 6/2004 | Willson et al. | 216/66 |
| 2004/0116548 A1 | 6/2004 | Willson | |
| 2004/0118809 A1 | 6/2004 | Chou et al. | 216/40 |
| 2004/0122862 A1 | 6/2004 | Willison et al. | 522/31 |
| 2004/0124566 A1 | 7/2004 | Sreenivasan et al. | 707/104.1 |
| 2004/0131718 A1 | 7/2004 | Chou et al. | 425/385 |
| 2004/0137734 A1 | 7/2004 | Chou et al. | 438/689 |
| 2004/0141163 A1 | 7/2004 | Bailey et al. | 264/494 |
| 2004/0141168 A1 | 7/2004 | Sreenivasan et al. | 355/18 |
| 2004/0146792 A1 | 7/2004 | Nimmakayata et al. | 355/75 |
| 2004/0149687 A1 | 8/2004 | Choi et al. | 430/22 |
| 2004/0150129 A1 | 8/2004 | Hougham et al. | 216/40 |
| 2004/0156108 A1 | 8/2004 | Chou et al. | 359/566 |
| 2004/0163563 A1 | 8/2004 | Sreenivasan et al. | 264/85 |
| 2004/0168586 A1 | 9/2004 | Bailey et al. | 101/494 |
| 2004/0168588 A1 | 9/2004 | Choi et al. | 10/150 |
| 2004/0168613 A1 | 9/2004 | Nguyen | 106/287.1 |
| 2004/0169441 A1 | 9/2004 | Choi et al. | 310/328 |
| 2004/0170770 A1 | 9/2004 | Nguyen | 427/407.1 |
| 2004/0170771 A1 | 9/2004 | Bailey et al. | 427/421.1 |
| 2004/0188381 A1 | 9/2004 | Sreenivasan et al. | 216/40 |
| 2004/0189994 A1 | 9/2004 | Sreenivasan et al. | 356/399 |
| 2004/0189996 A1 | 9/2004 | Sreenivasan et al. | 356/401 |
| 2004/0192041 A1* | 9/2004 | Jeong et al. | 438/689 |
| 2004/0197843 A1 | 10/2004 | Chou et al. | 435/7.92 |
| 2004/0200411 A1 | 10/2004 | Willson et al. | 118/500 |
| 2004/0202865 A1 | 10/2004 | Homola et al. | 428/421 |
| 2004/0209177 A1 | 10/2004 | Sreenivasan et al. | 430/22 |
| 2004/0223883 A1 | 11/2004 | Choi et al | 73/865.8 |

FOREIGN PATENT DOCUMENTS

| | | |
|---|---|---|
| EP | 244884 | 3/1987 |
| EP | 733455 | 9/1996 |
| EP | 867775 | 9/1998 |
| JP | 58-129074 | 8/1983 |
| JP | 1-196749 | 8/1989 |
| JP | 02-24848 | 1/1990 |
| JP | 02-92603 | 4/1990 |
| JP | 2192045 | 7/1990 |
| JP | 4-70379 | 5/1992 |
| WO | WO 87/02935 | 5/1987 |
| WO | WO 92/17883 | 10/1992 |
| WO | WO 98/10121 | 3/1998 |
| WO | WO 99/05724 | 2/1999 |
| WO | 99-45753 | 9/1999 |
| WO | WO 99/63535 | 12/1999 |
| WO | WO 00/21689 | 4/2000 |
| WO | WO 00/54107 | 9/2000 |
| WO | WO 01/33232 | 5/2001 |
| WO | WO 01/33300 | 5/2001 |
| WO | WO 01/47003 | 6/2001 |
| WO | WO 01/53889 | 7/2001 |
| WO | WO 01/63361 | 8/2001 |
| WO | WO 01/69317 | 9/2001 |
| WO | WO 01/79589 | 10/2001 |
| WO | WO 01/79591 | 10/2001 |
| WO | WO 01/79592 | 10/2001 |
| WO | WO 01/79933 | 10/2001 |
| WO | WO 01/90816 | 11/2001 |
| WO | WO 02/006902 | 1/2002 |
| WO | WO 02/07199 | 1/2002 |
| WO | WO 02/008835 | 1/2002 |
| WO | WO 02/17383 | 2/2002 |
| WO | WO 02/22916 | 3/2002 |
| WO | WO 02/24977 | 3/2002 |
| WO | WO 02/067055 | 8/2002 |
| WO | WO 03/010289 | 2/2003 |
| WO | WO 03/079416 | 9/2003 |
| WO | WO 03/099536 | 12/2003 |
| WO | WO 2004/006120 | 1/2004 |
| WO | WO 2004/016406 | 2/2004 |
| WO | WO 2004/034424 | 4/2004 |
| WO | WO 2004/044651 | 5/2004 |
| WO | WO 2004/054784 | 7/2004 |
| WO | WO 2004/055594 | 7/2004 |
| WO | WO 2004/063815 | 7/2004 |
| WO | WO 2004/114016 | 12/2004 |

OTHER PUBLICATIONS

Choi et al., Design of Orientation Stages for Step and Flash Imprint Lithography, Precision Engineering, pp. 192-199, Jan. 1, 2001.
Colburn et al., Step and Flash Imprint Lithography for sub-100 nm Patterning, Proceedings of SPIE vol. 3997, pp. 453-457, Jan. 1, 2000.
Chou et al., Imprint Lithography with 25-Nanometer Resolution, Science vol. 272, pp. 85-87, Apr. 5, 1996.
Chou et al., Imprint Lithography with Sub-10 nm Feature Size and High Throughput, Microelectronic Engineering 35, pp. 237-240, Jan. 1, 1997.
Haisma et al., Mold-assisted Nanolithography: A Process for Reliable Pattern Replication, J. Vac. Sci. Technol. B, pp 4124-4128, Nov. 1, 1996.
Heidari, Nanoimprint Lithography at the 6 in. Wafer Scale, J. Vac. Sci. Technol. B 18(6), pp. 3557-3560, Nov. 1, 2000.
Translation of Japanese Patent 02-92603.

Translation of Japanese Patent 02-24848.

Chou et al., Nanoimprint Lithography, Journal of Vacuum Science Technolgoy B 14(16), pp. 4129-4133, Nov. 1, 1996.

Colburn et al., Development and Advantages of Step-and-Flash Lithography, Solid State Technology, Jul. 1, 2001.

Colburn et al., Characterization and Modeling of Volumetric and Mechanical Properties for Step and Flash Imprint Lithography Photopolymers, Journal of Vacuum Science Technology, vol. b. 19(6), Nov. 1, 2001.

Bailey et al., Step and Flash Imprint Litography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Schneider et al., Stripes of Partially Fluorinated Alkyl Chains: Dipolar Langmuir Monolayers.

Abstract of Japanese Patent 58-129074, Aug. 1, 1983.

Ananthasuresh et al., "Strategies for Systematic Synthesis of Compliant Mems.", DSC-vol. 55-2, Dynamic Systems and Control: vol. 2, pp. 677-686, Nov. 1, 1994.

Arai et al., "Calibration and Basic Motion of Micro Hand Module.", IEEE, Jan. 1, 1993, pp. 1660-1665.

Arai et al., "Development of a New Parallel Manipulator with Fixed Linear Actuator.", In Proceedings of Japan/USA Symposium of Flexible Automation, Jan. 1, 1996, vol. 1, ASME, New York, pp. 145-149.

Armitage, "Analysis of Overlay Distortion Patterns.", Journal of Vacuum Science. B 20(6) pp. 2891-2895, Nov. 1, 2002.

"Photoresist Coating Methods.", E-mail from Susan Bagen (BAGEN@aol.com) to Dhaval Shah, Sep. 18, 1997.

Bender et al., "Fabrication of Nanostructures using a UV-based Imprint Technique.", Microelectronic Engineering 53, Jan. 1, 2000, pp. 233-236.

Bender et al., "Multiple Imprinting in UV-based Nanoimprint Lithography; Related Material Issues.", Microelectronic Engineering 61-62, Jan. 1, 2002, pp. 407-413.

Blomquist et al., "Fluorinated Acrylates in making Low-Loss, Low-Birefringence, and Single-Mode Optical Waveguides with Exceptional Thermo-Optic Properties.", SPIE Conference on Linear Optical Properties of Waveguides and Fibers, Jul. 1, 1999, vol. 3799, pp. 266-279.

Braeuer et al., "Precise Polymer Micro-Optical Systems.", MRS Bulleting, Jul. 1, 2001, pp. 519-522.

Chen et al., "Adaptive Alignment of Photomasks for Overlay Placement.", Journal of Vacuum Science. B20(6) pp. 3099-3105, Nov. 1, 2002.

Chou et al., "Imprint of Sub-25 nm Vias and Trenches in Polymers.", Applied Physics Letter, Nov. 20, 1995, 67 (21).

Chou et al., "Lithographically Induced Self-assembly of Perlodic Polymer Micropillar Arrays.", J. Vac. Sci. Technol., Nov. 1, 1999, B 17(6), pp. 3197-3202.

Chou, Ultrafast and Direct Imprint of Nanostructures in Silicon, Nature, Col. 417, (Jun. 2002), pp. 835-837.

Colburn et al., "Step and Flash Imprint Lithography: A New Approach to High-Resolution Patterning.", Proc of SPIE, vol. 3676.

Cowie, "Polymers: Chemistry and Physices of Modern Materials.", 2$^{nd}$ Ed., Jan. 1, 1991, pp. 408-409.

Eldada et al., "Advanced Polymer Systems for Optoelectronic Intergrated Circuit Applications.", SPIE, Jan. 1, 1997, vol. 3006, pp. 344-361.

Eldada et al., "Affordable WDM Components: The Polymer Solution.", SPIE, Jan. 1, 19998, vol. 3234, pp. 161-174.

Eldada et al., "Robust Photopolymers for MCM, Board, and Backplane Optical Interconnects.", SPIE, Jan. 1, 1996, vol. 3288, pp. 175-191.

Feldman et al., "Wafer Chuck Magnification Correction in X-Ray Lithography.", J. Vac. Sci. Technol. B 16(6), Nov. 1, 1998, pp. 3476-3479.

Gokan et al., "Dry Etch Resistance of Organic Materials.", J. Electrochem. Soc.: Solid-State Science and Technology, Jan. 1, 1983, pp. 143-146.

Goldfarb et al., "A Well-Behaved Revolute Flexure Joint for compliant Mechanism Design.", ASME Journal of Mechanical Design, Sep. 1, 1999, vol. 121, No. 3, pp. 424-429.

Goldfarb et al., "Compliant Micromanipulator Design for Scaled Bilateral Telemanipulation of Small-Scale Environments.", ASME International Mechanical Engineering Conference and Exposition, Nov. 1, 1998, DSC-vol. 64, pp. 213-218.

Hashimoto et al., "Design and Characteristics of a Parallel Link Compliant Wrist." IEEE, May 1, 1994, Department of Mechanical Engineering, Kagoshiam University, pp. 2457-2462.

Hexapods, "G1000-PS Power Series", www.hexapods.com.

Hexel Corporation, "Tornado 2000 System Specifications, ", www.hexel.com, Nov. 12, 1999.

Hiroshima et al., "Step-and-Repeat Photo-Nanoimprint System Using Active Orientation Head.", Japanese Journal of Applied Physics, Jun. 29, 2004, vol. 43, No. 6B, pp. 4012-4016.

Hogan et al., "Impedance Control: An Approch to Manipulation: Part 1-Theory.", Journal of Dynamic Systems, Measurement, and Control, Mar. 1, 1985, vol. 107, pp. 1-7.

Hollis et al., "A Six-Degree-of-Freedom Magnetically Levitated Variable Compliance Fine-Motion Wrist: Design, Modeling, and Control.", IEEE Transactions on Robotics and Automation, Jun. 1, 1991, vol. 7, No. 3, pp. 320-332.

Howell et al., "A Loop-Closure Theory for the Analysis and Synthesis of Compliant Mechanisms.", Journal of Mechanical Design, Mar. 1, 1996, vol. 188, pp. 121-125.

International Search Report for PCT/US 00/30041, Oct. 18, 2001.

International Search Report for PCT/US 01/26049, Feb. 19, 2002.

Johnson et al., "Advances in Step and Flash Imprint Lithography.", SPIE Microlithograhy Conference, Feb. 23, 2003.

Kanetomo et al., "Robot for Use in Ultrahigh Vacuum.", Solid State Technology, Aug. 1, 1997, pp. 63-72.

Kawata et al., "Imprint/Photo Hybrid Lithography Using Conventional Contact Aligner.", Japanese Journal of Applied Physics, Jun. 29, 2004, vol. 43, No. 68, pp. 4027-4030.

Kim et al., "High-precision Magnetic Levitation Stage for Photolithography.", Precision Engineering, Apr. 1, 1998, vol. 22., No. 2, pp. 66-77.

Kim et al., "Reducing Photocurable Polymer Pattern Shrinkage and Roughness during Dry Etching in Photo-Nanoimprint Lithography.", Japanese Journal of Applied Physics, Jun. 29, 2004, vol. 43, No. 6B, pp. 4022-4026.

Kim et al., "Surface Energy and Polarity of Treated Indium-Tin-Oxide Anodes for Polymer Light-Emitting Diodes Studied by Contact Angle Measurements.", Journal of Applied Physics, 1999, pp. 2774-2778. vol. 86, No. 5.

Koseki, "Design and Accuracy Evaluation of High-Speed and High Precision Parallel Mechanism.", Proc. Of IEEE, Jan. 1, 1998, Intl. Conf. on Robotics & Automation, pp. 1340-1345.

Kotachi et al., "Si-Containing Positive Resist for ArF Excimer Laser Lithography.", Photopolymer Science and Technology, Nov. 4, 1995, pp. 615-622.

Kumar et al., "Features of Gold Having Micrometer to Centimeter Dimensions can be Formed Through a Combination of Stamping with an Elastomeric Stamp and an Alkanethiol "ink" followed by Chemical Etching.", Applied Physics Letters, Oct. 4, 1993, vol. 63, Issue 14, pp. 2002-2004.

Lee et al., "An Ultraprecision Stage for Alignment of Wafers in Advanced Microlithography.", Precision Engineering, Sep. 1, 1997, pp. 113-122.

Lee et al., "Ultra Precision Positioning System for Servo Motor-plezo Actuator Using the Dual Servo Loop and Digital filter Implementation.", American Society for Precision Engineering, Jan. 1, 1998, pp. 287-290.

Lin, "Multi-Layer Resist Systems.", Introduction to Microlithography, Feb. 14, 1983, pp. 287-349.

Lucas Aerospace, Free-Flex@Pivot Catalog, Jan. 1, 1999.

Luurtsema, "Spin Coating for Rectangular Substrates.", Retrieved May 23, 2002 from URL; http://buffy.eecs.berkelye.edu/IRO/Summary/97abstracts.gluurts.2.html, May 23, 1992.

Mansky et al., "Large-Area Domain Alignment in Block Copolymer Thin Films Using Electric Fields.", Macromolecules, Jun. 9, 1998, vol. 31, No. 13, pp. 4399-4401.

Martin et al., "Predication of Fabrication Distortions In Step and Flash Imprint Lithography Templates.", Journal of Vacuum Science. B 20(6) pp. 2891-2895, Nov. 1, 2002.

Merlet, "Parallel Manipulators: State of the Art and Perspectives.", Advanced Robotics, Jan. 1, 1994, vol. 8, pp. 589-596.

Mirkin et al., "Emerging Methods for Micro-and-Nanofabrication.", MRS Bulletin, Jul. 1, 2001, pp. 506-509.

Mitsui et al., "Application of Two-Wavelength Optical Heterodyne Alignment System in XS-1.", Part of the SPIE Conference on Emerging Lithographic Technologies III, Mar. 1, 1999, SPIE vol. 3676, pp. 455-464.

Mittal, "Precision Motion Control of a Magnetic Suspension Actuator Using a Robust Nonlinear Compensation Scheme.", IEE/ASME Transactions on Mechatronics., Dec. 1, 1997, vol. 2, No. 4, pp. 268-280.

Moon et al., Interferometric-Spatial-Phase Imaging for Six-Axis Mask Control, Oct. 17, 2003, MIT Nanostructures Laboratory, Research Laboratory of Electronics.

Nakamatsu et al., "Bitlayer Resist Method for Room-Temperature Nanoimprint Lithography.", Japanese Journal of Applied Physics, Jun. 29, 2004, vol. 43, No. No. 6B, pp. 4050-4053.

Nerac.com Retro Search, "Imprint Lithography." Oct. 16, 2004.

Office Action from U.S. Pat. Appl. 10/053,357, Dec. 16, 2003.

Ohya et al., "Development of 3-DOF Finger Module for Micro Manipulation.", Proc. of IEEE, Mar. 1, 1999, Intl. Conf. on Intelligent Robots and Systems, pp. 894-899.

Otto et al., "Characterization and Application of a UV-based Imprint Technique.", Microelectronic Engineering 57-58, Jan. 1, 2001, pp. 361-366.

Otto et al., "Reproducibility and Homogeneity In Step and Repeat UV-Nanoimprint Lithography.", Microelectronic Engineering 73-74, Jan. 1, 2004, pp. 152-156.

Otto et al., "Step and Repeat UV-Nanoimprint Lithography: Material Issues.", NNT02 San Francisco, Dec. 11, 2002.

Parikh et al., "An Intrinsic Relationship between Molecular Structure in Self-Assembled n-Alkylsiloxane Monolayers and Deposition Temperature.", Journal of Phys. Chem., Jul. 1, 1994, pp. 7577-7590.

Paros et al., "How to design Flexure Hinges.", Machine Design, Nov. 25, 1965, pp 151-156.

Peng et al., "Compliant Motion Control of Kinematically Redundant Manipulators.", IEEE Transactions on Robotics and Automation, Dec. 1, 1993, vol. 9, No. 6, pp. 831-837.

Pernette et al., "Design of Parallel Robots in Microbotics.", Robotica, Jan. 1, 1997, vol. 15, pp. 417-420.

Physik Instruments, "Hexapod Six-Axis Parallel Kinematics Robot", Nano Positioning, Jan. 1, 1998, pp. 8.4-8.5.

Physik Instruments, "NanoPositioning, MicroPositioning, Plezo Technology.", Pl Online Catalog, Jan. 1, 1999, www.physikinstuments.com.

Physik Instruments, "Product Catalog for Micropositioning", 1997.

Raibert et al., "Hybrid Position/Force Control of Manipulators.", Journal of Dynamic Systems, Measurement, and Control, Jun. 1, 1981, vol. 102, pp. 126-133.

Rong et al., "Design and Analysis of Flexure-Hinge Mechanism Used in Micro-Positioning Stages.", ASME, Jan. 1, 1994, vol. 2, pp. 979-985.

Rong et al., "Dynamics of Parallel Mechanism with Direct Compliance Control.", IEEE, Jan. 1, 1997, pp. 1753-1758.

Ruchhoeft et al., "Patterning Curved Surfaces: Template Generation by Ion Beam Proximity Lithography and Relief Transfer by Step and Flash Imprint Lithography.", Journal of Vacuum Science and Technology, pp. 1-17.

Sagiv, "Organized Monolayers by Absorption. 1. Formation and Structure of Oleophobic Mixed Monolayers on Solid Surfaces.", Journal of American Chemical Society/102:1, Jan. 2, 1980.

Schneider et al., "The Wave-Printer: Towards Large-Area, Multilayer Microcontact Printing.", Proc. of 4$^{th}$ euspen International Conference, Glasgos, Scotland (UK), May 1, 2004.

Slocum, "Precision Machine Design: Macromachine Design Philosophy and its Applicability to the Design of Micomachines.", Micro Electro Mechanical Systems, Feb. 4, 1992.

Sowah, "Diamond Used to Break the Mould [online].", [Retrieved on Sep. 2, 2003.] Retried from the Internet: <URL: http: HTTP://eetuk.com/showArticle,jhtml?articleID=19203691>., Sep. 2, 2003.

Sreenivasan et al., "IDF Spin Cast Imprinting.", Oct. 21, 2004, Powerpoint Presentation.

Srinivasan et al., "Alkyltrichlorosilane-Based Self-Assembled Monolayer Films for Stiction Reduction in Silicon Micromachines.", Journal of Microelectromechanical Systems, Jun. 1, 1998, vol. 7, No. 2, p. 252-260.

Stewart, "A Platform With Six Degrees of Freedom.", Proc Instn Mech Engrs, May 28, 1965, vol. 180, Pt1, No. 15, pp. 371-378.

Stix, "Getting More from Moores", Scientific American.

Tajbakhsh et al., "Three-Degree-of-Freedom Optic Mount for Extreme Ultraviolet.", American Society for Precision Engineering, Jan. 1, 1998, pp. 359-362.

Tanikawa et al., "Development of Small-sized 3 DOF Finger Module in Micro Hand for Micro Manipulation.", Proc. of IEEE, Mar. 1, 1999, Intl. conf. on Intelligent Robots and Systems, pp. 876-881.

Tomita et al., "A 6-axes Motion Control Method for Parallel-Linkage-Type Fine Motion Stage.", JSPE-58-04, pp. 118-124.

Trilogy Systems, "Linear Motors 310.", wwww.trilogysystems.com, Jan. 1, 2001.

Uchida et al., "A Mask-to-Wafer Alignment and Gap Setting Method for X-ray Lithography Using Graftings.", Journal Vacuum Science Technology, Nov. 1, 1991, B 9 (6), pp. 3202-3206.

U.S. Appl. No. 09/698,317, filed Oct. 27, 2000, Choi et al., "High Precision Orientation Alignment and Gap Control Stages for Imprint Lithography Processes."

U.S. Appl. No. 09/934,248, filed Aug. 21, 2001, Choi et al., "Flexure Based Macro Motion Translation Stage."

U.S. Appl. No. 09/976,681, filed Oct. 12, 2001, Bailey et al., "Template for Room Temperature, Low Pressure Micro- and Nano-imprint Lithography."

U.S. Appl. No. 10/136,188, filed May 1, 2002, Voisin et al., "Methods of Manufacturing a Lithography Template."

U.S. Appl. No. 10/194,410, filed Jul. 11, 2002, Sreenivasan et al., Method and System for Imprint Lithography Using an Electric Field.

U.S. Appl. No. 10/375,817, filed Feb. 27, 2003, Nguyen et al., "Method to Reduce Adhesion between a Polymerizable Layer and a Substrate Employing a Flourine-Containing Layer."

U.S. Appl. No. 10/375,832, filed Feb. 27, 2003, Nguyen et al., "Composition and Method to Form a Release Layer."

U.S.Appl. No. 10/396,615, filed Mar. 25, 2003, Sreenivasan, "Low Surface Energy Templates."

U.S. Appl. No. 10/423,642, filed Apr. 25, 2003, Sreenivasan, "A Method of Forming Stepped Structures Employing Imprint Lithography."

U.S. Appl. No. 10/437,476, filed May 14, 2003, Meissl, et al., "An Assembly and Method for Transferring Imprint Lithography Templates."

U.S. Appl. No. 10/438,224, filed May 14, 2003, Meissl et al., "Method, System and Holder for Transferring Templates During Imprint Lithography Processes."

U.S. Appl. No. 10/463,396, filed Jun. 17, 2003, Choi et al., "Method to Reduce Adhesion Between a Conformable Region and a Pattern of a Mold."

U.S. Appl. No. 10/614,716, filed Jul. 7, 2003, Sreenivasan et al., "A Conforming Template for Patterning Liquids Disposed on Substrates."

U.S. Appl. No. 10/666,527, filed Sep. 18, 2003, Bailey et al., "Imprint Lithography Templates having Alignment Marks."

U.S. Appl. No. 10/677,639, filed Oct. 16, 2003, McMackin et al., "Single Phase Fluid Imprint Lithography Method."

U.S. Appl. No. 10/687,562, filed Oct. 16, 2003, Cherala et al., "Applying Imprinting Material to Substrates Employing Electromagnetic Fields."

U.S. Appl. No. 10/694,284, filed Oct. 27, 2003, XU, "Methods for Fabricating Patterned Features Utilizing Imprint Lithography."

U.S. Appl. No. 10/735,110, filed Dec. 12, 2003, Nimmakayala et al., "Magnification Correction Employing Out-of-Plane Distortion of a Substrate."

U.S. Appl. No. 10/747,795, filed Dec. 29, 2003, Sreenivasan et al., "Imprint Lithography Template Comprising Alignment Marks."

U.S. Appl. No. 10/760,821, filed Jan. 20, 2004, Sreenivasan et al., "Method for Concurrently Employing Differing Materials to Form a Substrate."

U.S. Appl. No. 10/775,707, filed Feb. 10, 2004, Choi et al., "An Apparatus to Orientate a Body with Respect to a Surface."

U.S. Appl. No. 10/784,911, filed Feb. 23, 2004, XU, "Materials for Imprint Lithography."

U.S. Appl. No. 10/785,248, filed Feb. 24, 2004, Choi et al., "A Method to Control the Relative Position Between a Body and a Surface."

U.S. Appl. No. 10/788,685, filed Feb. 27, 2003, Choi et al., "A Method of Orientating a Template with Respect to a Substrate in Response to a Force Exerted on the Template."

U.S. Appl. No. 10/788,700, filed Feb. 27, 2004, Sreenivasan et al., "Full-Wafer or Large Area Imprinting with Multiple Separated Sub-Fields for High Throughput Lithography."

U.S. Appl. No. 10/805,916, filed Mar. 22, 2004, Sreenivasan et al., "A Method of Determining Alignment of a Template and a Substrate having a Liquid Disposed Therebetween."

U.S. Appl. No. 10/806,956, filed Mar. 23, 2003, Choi et al., "An Apparatus to Control Displacement of a Body Spaced-Apart from a Surface."

U.S. Appl. No. 10/864,214, filed Jun. 9, 2004, Sreenivasan et al., "An Imprint Lithography System to Produce a Light to Impinge upon and Polymerize a Liquid in Superimposition with Template Overlay Marks."

U.S. Appl. No. 10/898,034 filed Jul. 23, 2004, McMackin et al., "A Method of Creating a Turbulent Flow of Flui between a Mold and a Substrate."

U.S. Appl. No. 10/898,037, filed Jul. 23, 2004, McMackin et al., "A System of Creating a Turbulent Flow of Fluid between a Mold and a Substrate."

U.S. Appl. No. 60/394,458, filed Jul. 8, 2002, Sreenivasan et al., "Method and Apparatus for Whole Wafer Planarization using Optical flats and Light Curable Liquids."

U.S. Appl. No. 10/194,991, filed Jul. 11, 2002, Sreenivasan et al., "Step and Repeat Lithography Processes."

U.S. Appl. No. 10/616,294 filed Jul. 9, 2003, Choi et al., "Systems for Magnification and Distortion Correction for Imprint Lithography Processes."

U.S. Appl. No. 10/687,519, filed Oct. 16, 2003, Nguyen et al., "Low Surfaced Energy Template."

Vanderbilt, "VU9730 Specifications for Improved Flexure Device.", Vanderbilt University Office of Transfer Technology, 101, 25, 192-199.

Wang et al., "Passive Compliance versus Active Compliance in Robot-Based Automated Assembly Systems.", Industrial Robot, Jan. 1, 1998, vol. 25, No. 1, pp. 46-57.

White et al., "Novel Alignment System for Imprint Lithography.", J. Vac. Sci. Technol. B 18(6), Nov. 1, 2000, pp. 3552-3556.

Williams et al., "Six Degree of Freedom Mag-Lev Stage Development.", SPIE, Jan. 1, 1997, vol. 3051, pp. 856-867.

Wu, "Large Area High Density Quantized Magnetic Magnetic Disks Fabricated Using Nanoimprint Lithography.", J. Vac. Sci. Technol., Nov. 1, 1998, B 16(6), pp. 3825-3829.

* cited by examiner

SYSTEM FOR DETERMINING CHARACTERISTICS OF SUBSTRATES EMPLOYING FLUID GEOMETRIES

CROSS-REFERENCE TO RELATED APPLICATIONS

The present application is a divisional application of U.S patent application Ser. No. 10/318,365 entitled METHOD FOR DETERMINING CHARACTERISTICS OF SUBSTRATES EMPLOYING FLUID GEOMETRIES, filed Dec. 12, 2002 now U.S. Pat. No. 6,871,558, and is a divisional of U.S patent application Ser. number 10/863,800 entitled SYSTEM FOR DETERMINING CHARACTERISTICS OF SUBSTRATES EMPLOYING FLUID GEOMETRIES, filed Jun. 8, 2004, both of which are incorporated by reference herein.

BACKGROUND OF THE INVENTION

The present invention relates generally to lithography systems. More particularly, the present invention is directed to determining spatial relationships between an imprinting mold and a substrate upon which a pattern will be formed using the imprinting mold.

Imprint lithography has shown promising results in fabrication of patterns having feature sizes smaller than 50 nm. As a result, many prior art imprint lithography techniques have been advocated. U.S. Pat. No. 6,334,960 to Willson et al. discloses an exemplary lithography imprint technique that includes providing a substrate having a transfer layer. The transfer layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The transfer layer and the solidified polymeric material are subjected to an environment to selectively etch the transfer layer relative to the solidified polymeric material to form a relief image in the transfer layer.

U.S. Pat. No. 5,772,905 to Chou discloses a lithographic method and apparatus for creating patterns in a thin film coated on a substrate in which a mold, having at least one protruding feature, is pressed into a thin film carried on a substrate. The protruding feature in the mold creates a recess in the thin film. The mold is removed from the thin film. The thin film then is processed such that the thin film in the recess is removed exposing the underlying substrate. Thus, patterns in the mold are replaced in the thin film, completing the lithography process. The patterns in the thin film will be, in subsequent processes, reproduced in the substrate or in another material which is added onto the substrate.

Yet another imprint lithography technique is disclosed by Chou et al. in *Ultrafast and Direct Imprint of Nanostructures in Silicon*, Nature, Col. 417, pp. 835–837, June 2002, which is referred to as a laser assisted direct imprinting (LADI) process. In this process a region of a substrate is made flowable, e.g., liquefied, by heating the region with the laser. After the region has reached a desired viscosity, a mold, having a pattern thereon, is placed in contact with the region. The flowable region conforms to the profile of the pattern and is then cooled, solidifying the pattern into the substrate.

An important consideration when forming patterns in this manner is to maintain control of the distance and orientation between the substrate and the mold that contains the pattern to be recorded on the substrate. Otherwise, undesired film and pattern anomalies may occur.

There is a need, therefore, for accurately determining spatial relationships between a mold and a substrate upon which the mold will form a pattern using imprinting lithographic processes.

SUMMARY OF THE INVENTION

The present invention provides a system for determining characteristics of a first substrate, lying in a first plane, and a second substrate, lying in a second plane with a volume of fluid disposed therebetween. The system includes a displacement mechanism to cause relative movement between the volume and one of the first and second substrates to effectuate a change in properties of an area of the fluid, defining changed properties. A detector system senses the changed properties and produces data in response thereto. A processing system receives the data and produces information corresponding to the characteristics. These and other embodiments are discussed more fully below.

DETAILED DESCRIPTION OF THE INVENTION

Figure 1:
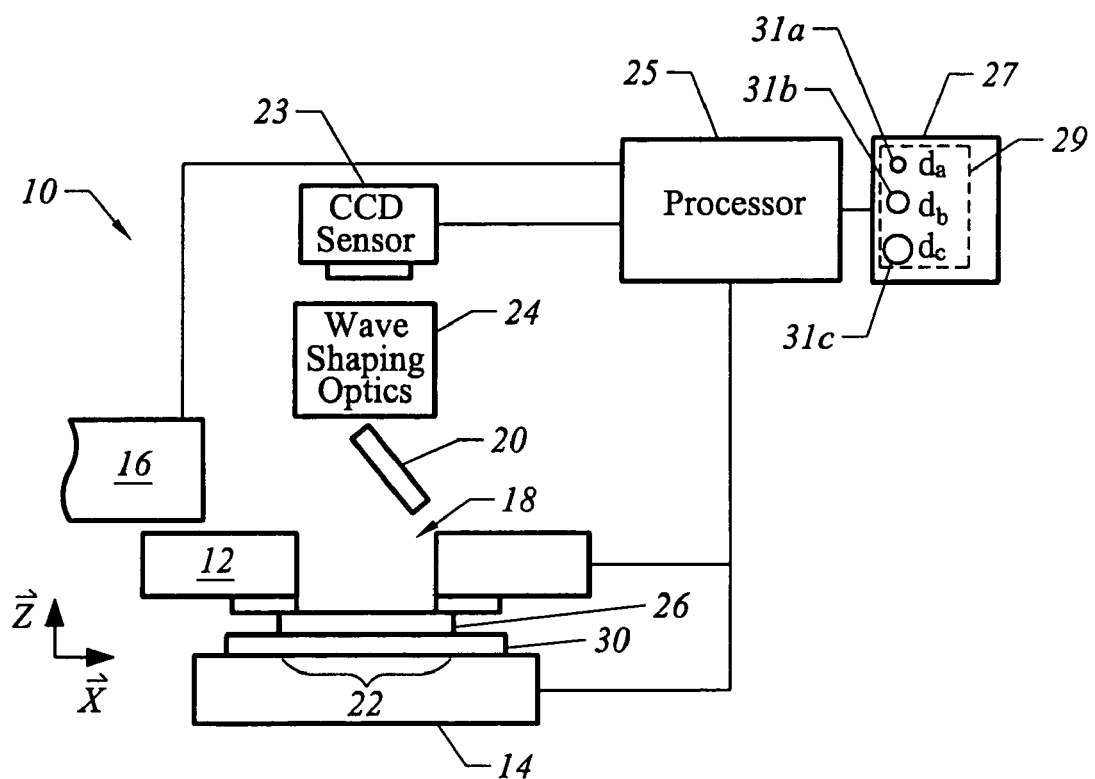
FIG. 1 is a simplified plan view of a lithographic system incorporating a detection system in accordance with one embodiment of the present invention.

FIG. 1 depicts a lithographic system 10 in which a detection system in accordance with one embodiment of the present invention is included. System 10 includes an imprint head 12 and a stage 14, disposed opposite to imprint head 12. A radiation source 16 is coupled to system 10 to impinge actinic radiation upon motion stage 14. To that end, imprint head 12 includes a throughway 18 and a mirror 20 couples actinic radiation from radiation source 16, into throughway 18, to impinge upon a region 22 of stage 14. Disposed opposite to region 22 is a detection system that includes a CCD sensor 23 and wave shaping optics 24. CCD sensor 23 is positioned to sense images from region 22. Detection system is configured with wave shaping optics 24 positioned between CCD sensor 23 and mirror 20. A processor 25 is in data communication with CCD sensor 23, imprint head 12, stage 14 and radiation source 16.

Figure 2:
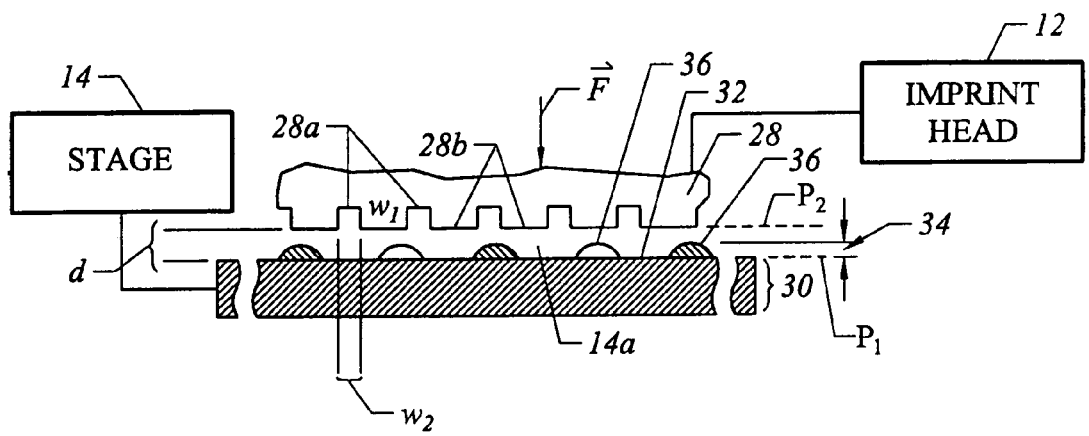
FIG. 2 is a partial simplified elevation view of a lithographic system shown in FIG. 1.

Referring to both FIGS. 1 and 2, connected to imprint head 12 is a first substrate 26 having a mold 28 thereon. First substrate 26 may be held to imprint head 12 using any known technique. In the present example first substrate 26 is retained by imprint head 12 by use of a vacuum chuck (not shown) that is connected to imprint head 12 and applies a vacuum to first substrate 26. An exemplary chucking system that may be included is disclosed in U.S. patent application Ser. No. 10/293,224 entitled "A Chucking System for Modulating Shapes of Substrates", which is incorporated by reference herein. Mold 28 may be planar or include a feature thereon. In the present example, mold 28 includes a plurality of features defined by a plurality of spaced-apart recessions 28a and protrusions 28b. The plurality of features defines an original pattern that is to be transferred into a second substrate, such as wafer 30, coupled to stage 14. To that end, imprint head 12 is adapted to move along the Z axis and vary a distance "d" between mold 28 and wafer 30. Stage 14 is adapted to move wafer 30 along the X and Y axes, with the understanding that the Y axis is into the sheet upon which FIG. 1 is shown. With this configuration, the features on mold 28 may be imprinted into a flowable region of wafer 30, discussed more fully below. Radiation source 16 is located so that mold 28 is positioned between radiation source 16 and wafer 30. As a result, mold 28 is fabricated from material that allows it to be substantially transparent to the radiation produced by radiation source 16, such as fused silica or quartz glass.

Figure 3:
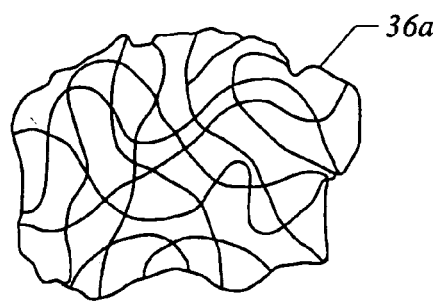
FIG. 3 is a simplified representation of material from which an imprinting layer, shown in FIG. 2, is comprised before being polymerized and cross-linked.

Referring to both FIGS. 2 and 3, a flowable region, such as an imprinting layer 34, is disposed on a portion of surface 32 that presents a substantially planar profile. Flowable region may be formed using any known technique such as a hot embossing process disclosed in U.S. Pat. No. 5,772,905, which is incorporated by reference in its entirety herein, or a laser assisted direct imprinting (LADI) process of the type described by Chou et al. in *Ultrafast and Direct Imprint of Nanostructures in Silicon*, Nature, Col. 417, pp. 835–837, June 2002. In the present embodiment, however, flowable region consists of imprinting layer 34 being deposited as a plurality of spaced-apart discrete beads 36 of material 36a on wafer 30, discussed more fully below. Imprinting layer 34 is formed from a material 36a that may be selectively polymerized and cross-linked to record the original pattern therein, defining a recorded pattern. Material 36a is shown in FIG. 4 as being cross-linked at points 36b, forming cross-linked polymer material 36c.

Figure 5:
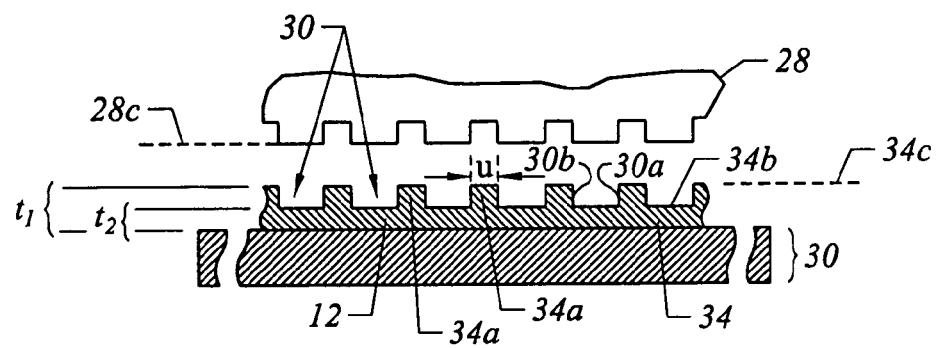
FIG. 5 is a simplified elevation view of a mold spaced-apart from an imprinting layer, shown in FIG. 1, after patterning of the imprinting layer.

Referring to FIGS. 2, 3 and 5, the pattern recorded in imprinting layer 34 is produced, in part, by mechanical contact with mold 28. To that end, imprint head 12 reduces the distance "d" to allow imprinting layer 34 to come into mechanical contact with mold 28, spreading beads 36 so as to form imprinting layer 34 with a contiguous formation of material 36a over surface 32. Were mold 28 provided with a planar surface, distance "d" would be reduced to provide imprinting layer 34 with a substantially planar surface. In the present example, distance "d" is reduced to allow sub-portions 34a of imprinting layer 34 to ingress into and fill recessions 28a.

To facilitate filling of recessions 28a, material 36a is provided with the requisite properties to completely fill recessions 28a while covering surface 32 with a contiguous formation of material 36a. In the present example, sub-portions 34b of imprinting layer 34 in superimposition with protrusions 28b remain after the desired, usually minimum distance "d", has been reached, leaving sub-portions 34a with a thickness $t_1$, and sub-portions 34b with a thickness, $t_2$. Thicknesses "$t_1$" and "$t_2$" may be any thickness desired, dependent upon the application. Typically, $t_1$ is selected so as to be no greater than twice the width u of sub-portions 34a, i.e., $t_1 < 2u$, shown more clearly in FIG. 5.

Figure 4:
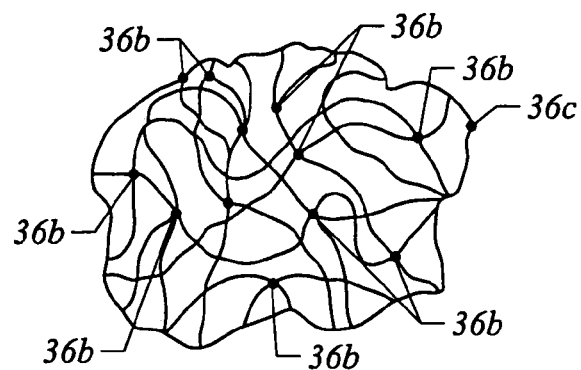
FIG. 4 is a simplified representation of cross-linked polymer material into which the material, shown in FIG. 3, is transformed after being subjected to radiation.

Referring to FIGS. 2, 3 and 4, after a desired distance "d" has been reached, radiation source 16, shown in FIG. 1, produces actinic radiation that polymerizes and cross-links material 36a, forming cross-linked polymer material 36c. As a result, the composition of imprinting layer 34, transforms from material 36a to material 36c, which is a solid. Specifically, material 36c is solidified to provide side 34c of imprinting layer 34 with a shape conforming to a shape of a surface 28c of mold 28, shown more clearly in FIG. 5. After imprinting layer 34 is transformed to consist of material 36c, shown in FIG. 4, imprint head 12, shown in FIG. 2, is moved to increase distance "d" so that mold 28 and imprinting layer 34 are spaced-apart.

Figure 6:
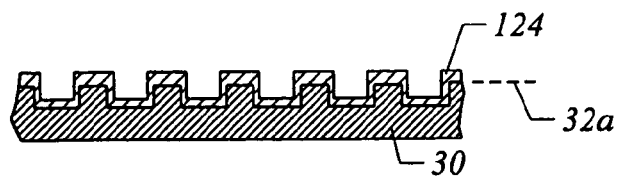
FIG. 6 is a simplified elevation view of an additional imprinting layer positioned atop of the substrate, shown in FIG. 5, after the pattern in the first imprinting layer is transferred therein.

Referring to FIG. 5, additional processing may be employed to complete the patterning of wafer 30. For example, wafer 30 and imprinting layer 34 may be etched to transfer the pattern of imprinting layer 34 into wafer 30, providing a patterned surface 32a, shown in FIG. 6. To facilitate etching, the material from which imprinting layer 34 is formed may be varied to define a relative etch rate with respect to wafer 30, as desired. The relative etch rate of imprinting layer 34 to wafer 30 may be in a range of about 1.5:1 to about 100:1.

Alternatively, or in addition to, imprinting layer 34 may be provided with an etch differential with respect to photo-resist material (not shown) selectively disposed thereon. The photo-resist material (not shown) may be provided to further pattern imprinting layer 34, using known techniques. Any etch process may be employed, dependent upon the etch rate desired and the underlying constituents that form wafer 30 and imprinting layer 34. Exemplary etch processes may include plasma etching, reactive ion etching, chemical wet etching and the like.

Referring to both FIGS. 1 and 2, an exemplary radiation source 16 may produce ultraviolet radiation. Other radiation sources may be employed, such as thermal, electromagnetic and the like. The selection of radiation employed to initiate the polymerization of the material in imprinting layer 34 is known to one skilled in the art and typically depends on the specific application which is desired. Furthermore, the plurality of features on mold 28 are shown as recessions 28a extending along a direction parallel to protrusions 28b that provide a cross-section of mold 28 with a shape of a battlement. However, recessions 28a and protrusions 28b may correspond to virtually any feature required to create an integrated circuit and may be as small as a few tenths of nanometers. As a result, it may be desired to manufacture components of system 10 from materials that are thermally stable, e.g., have a thermal expansion coefficient of less than about 10 ppm/degree Centigrade at about room temperature (e.g. 25 degrees Centigrade). In some embodiments, the material of construction may have a thermal expansion coefficient of less than about 10 ppm/degree Centigrade, or less than 1 ppm/degree Centigrade.

Figure 7:
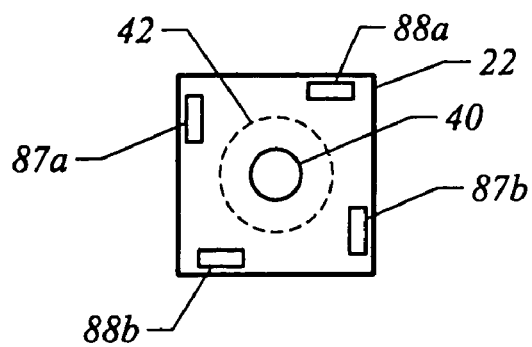
FIG. 7 is a top-down view of a region of a wafer, shown in FIG. 1, that is sensed by a detection system shown therein in accordance with one embodiment of the present invention.

Referring to FIGS. 1, 2 and 7, an important consideration to successfully practice imprint lithography techniques is accurately determining distance "d". To that end, the detection system of the present invention is configured to take advantage of the change in the geometry of beads 36 as the distance "d" is reduced. Assuming beads 36 behave as a non-compressible fluid with a volume "v", distance "d" may be defined as follows:

$$d = V/A \quad (1)$$

where A is a liquid filled area measured by CCD sensor 23. To that end, the combination of CCD sensor 23 and wave shaping optics 24 allows the detection system to sense one or more beads 36 in region 22. With first substrate 26 spaced-apart from wafer 30, the volume of one or more beads 36 provides each bead 36 with an area 40 associated therewith. As distance "d" is reduced and substrate 26 comes into mechanical contact with beads 36, compression occurs. This compression effectuates a change in properties of the area 40 of beads 36, referred to as changed properties. These changes relate to the geometries of one or more beads 36, such as the shape, size or symmetry of the area 40. In the present example the changed properties are shown as 42 and concern the size of the area 40. Specifically, the compression results in the area 40 of beads 36 increasing.

The change in area 40 is sensed by CCD sensor 23, which produces data corresponding to the same. Processor 25 receives the data corresponding to the change in the area 40 and calculates, using equation 1, the distance "d". Assuming CCD sensor 23 consists of a N×M array of pixels, distance "d" is ascertained by processor 25 through the following equation:

$$d = V/t_p(P_a) \quad (2)$$

where $t_p$ is the total number of pixels in the N×M array and $P_a$ is the area of each pixel.

With volume of beads 36 being fixed, the resolution of CCD sensor 23 that is desired to accurately measure the area A may be defined as follows:

$$\Delta A = (A/_d)\Delta d \quad (3)$$

Assuming that the total volume, v, of one of beads 36 sensed by CCD sensor 23 is 200 nl, i.e., 0.1 mm$^3$ and d=200 nm, then liquid filled area "A" is 1000 mm$^2$. From equation (2) it may be determined that the desired resolution of CCD sensor 23 is 5 mm$^2$.

It should be noted that processor 25 may be employed in a feedback loop operation. In this manner, distance "d" may be calculated multiple times until it is determined that the desired distance "d" has been reached. Such calculations may be performed dynamically in real time, or sequentially, with the distance "d" being determined as incremental movements of imprint head 12 along the Z axis occur.

Alternatively, or in addition thereto, processor 25 may be in data communication with a memory 27 that includes computer-readable information in the form of a look-up table 29. The information in look-up table 29 may include geometries, shown as 31a, 31b and 31c as related to differing distances, shown as $d_a$, $d_b$ and $d_c$. In this manner, information concerning the geometry of one or more beads 36 may be obtained by CCD sensor 23 and received by processor 25. The information is then processed to relate the same to the geometry in look-up table 29 that most closely matches the geometry of the one or more beads 36 sensed by CCD sensor 23. Once a match is made, processor 25 determines a magnitude of distance "d" present in look-up table 29 that is associated with the matching geometry.

Figure 8:
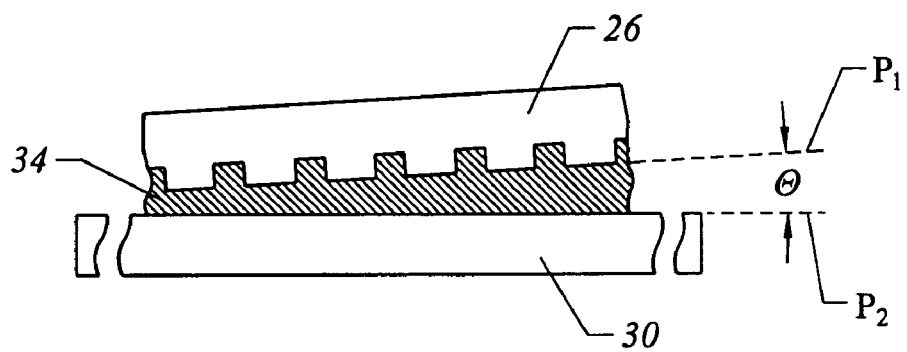
FIG. 8 is a cross-section of the resulting shape of an imprinting layer shown in FIG. 1, being formed with the mold and the wafer not being in parallel orientation with respect to one another.

Additional information concerning characteristics of first substrate 26 and wafer 30 other than the distance "d" therebetween may be obtained by analyzing the fluid geometry of one or more beads 36. For example, by analyzing the symmetry of beads 36 an angular orientation between first substrate 26 and wafer 30 may be determined. Assume first substrate 26 lies in a first plane $P_1$ and wafer 30 lies in a second plane $P_2$. Assuming area 40 is radially symmetric, any loss of radial symmetry in area 40 may be employed to determine that first plane $P_1$ and second plane $P_2$ do not extend parallel to one another. Additionally, data concerning the shape of area 40, in this case the lack of radial symmetry, may be employed to determine the angle Θ formed between first and second planes $P_1$ and $P_2$ and, therefore, between first substrate 26 and wafer 30, shown in FIG. 8. As a result, undesired thicknesses in imprinting layer 34 may be ascertained and, therefore, avoided. Other information may be obtained, as well, such as the contamination of first substrate 26 or wafer 30 or both by particulate matter.

Specifically, the presence of particulate matter on substrate 26 may manifest as many different shapes. For purposes of the present discussion, one or more beads 36, shown in FIG. 2, having an asymmetrical area associated therewith may indicate the presences of particulate contaminants on either first substrate 26 or wafer 30. Further, with a priori knowledge of contaminants, specific shapes of one ore more beads 36 may be associated with a particular defect, such as particulate contamination, as well as the presence of the defect, e.g., on first substrate 26, wafer 30 and/or stage 14. This information may be included in a look-up table as discussed above so that processor may classify the defect and characterize first substrate 26 and/or wafer 30, accordingly.

Figure 9:
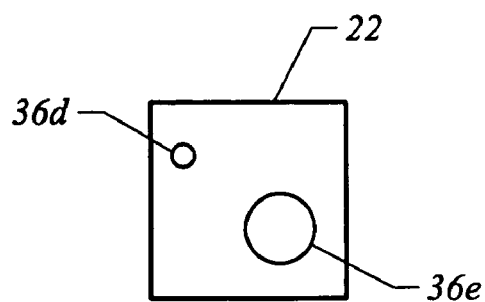
FIG. 9 is a top-down view of a region of a wafer, shown in FIG. 1, that is sensed by a detection system shown therein in accordance with an alternate embodiment of the present invention.

Referring to FIGS. 1, 2 and 9, by analyzing information from two or more beads, shown as 36d and 36e in region 22, the magnitude of the distance "d" between first substrate 26 and wafer 30 may be concurrently determined at differing sites. The distance information for each of beads 36d and 36e is determined as discussed above. Assuming beads 36d and 36e have substantially identical areas, changes in the areas due to first substrate 26 coming into mechanical contact therewith should be substantially the same, were first substrate 26 and wafer 30 substantially parallel and the distance, "d", would be uniform over region 22. Any difference between the areas of beads 36d and 36e after mechanical contact with first substrate 26 may be attributable to first substrate 26 and wafer 30 not being parallel, which could result in a non-uniform distance "d" between first substrate 26 and wafer 30 over region 22. Further, the angle θ formed between first substrate 26 and wafer 30 may be determined from this information, as discussed above. Assuming that areas of beads 36d and 36e differed initially, similar information may be obtained by comparing the relative changes in the areas of beads 36d and 36e that result from mechanical contact with first substrate 26.

Specifically, it may be determined by analyzing the relative changes between areas of beads 36d and 36e it may be determined whether first substrate 26 and wafer 30 at regions located proximate to beads 36d and 36e are spaced apart an equal distance "d". If this is the case, then it may be concluded that first substrate 26 and wafer 30 extend parallel to one another. Otherwise, were first substrate 26 and wafer 30 found not to extend parallel to one another, the magnitude of the angle θ formed therebetween may be determined.

Figure 10:
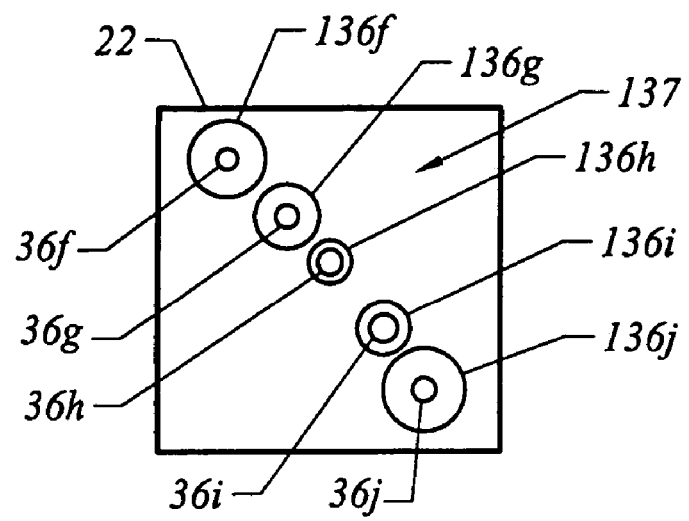
FIG. 10 is a top-down view of a region of a wafer, shown in FIG. 1, that is sensed by a detection system shown therein in accordance with another alternate embodiment of the present invention.

Referring to FIGS. 1, 2 and 10, another advantage of examining multiple beads in a regions, such as beads 36f, 36g, 36h, 36i and 36j, is that a shape of either first substrate 26 or wafer 30 may be obtained. This is shown by examining the changes in beads 36. For example, after compression of beads 36f, 36g, 36h, 36i and 36j by first substrate 26 each is provided with area 136f, 136g, 136h, 136i and 136j, respectively that defines a compression pattern 137. As shown, beads 36f and 36j have the greatest area, beads 36g and 36i have the second greatest area and bead 36h has the smallest area. This may be an indication that first substrate 26 has a concave surface, i.e., is bowed, or that wafer 30 is bowed. From experimental analysis additional information concerning differing types of compression patterns may be obtained to classify and characterize differing shapes or defects in system 10. These may also be employed in look-up table 29 so that processor 25 may match a compression pattern sensed by CCD sensor 23 with a compression pattern in look-up table 29 and automatically ascertain the nature of processing performed by system 10, i.e., whether system 10 is functioning properly and/or acceptable imprints are being generated.

CCD sensor 23 may also be implemented for endpoint detection of the spreading of imprinting layer 34 over wafer 30. To that end, one or more pixel of CCD sensor 23 may be arranged to sense a portion of wafer 30. The portion, shown as 87a, 87b, 88a and 88b, in FIG. 7, is located in region 22 and is proximate to a periphery of imprinting layer 34 after "d" has reached a desired magnitude. In this fashion, pixels of CCD sensor 23 may be employed as an endpoint detection system that indicates when a desired distance "d" has been achieved, thereby resulting in spreading of beads 36 to form imprinting layer 34 of desired thicknesses. This facilitates determining the magnitude of movement imprint head 12 should undertake in order to facilitate an imprint of imprinting layer 34. To that end, once CCD sensor 23 detects the presence of imprinting layer 34 proximate to portions 87a, 87b, 88a and 88b, data concerning the same is communicated to processor 25. In response, processor 25 operates to halt movement of imprint head 12, fixing the distance "d" between first substrate 26 and wafer 30.

Figure 11:
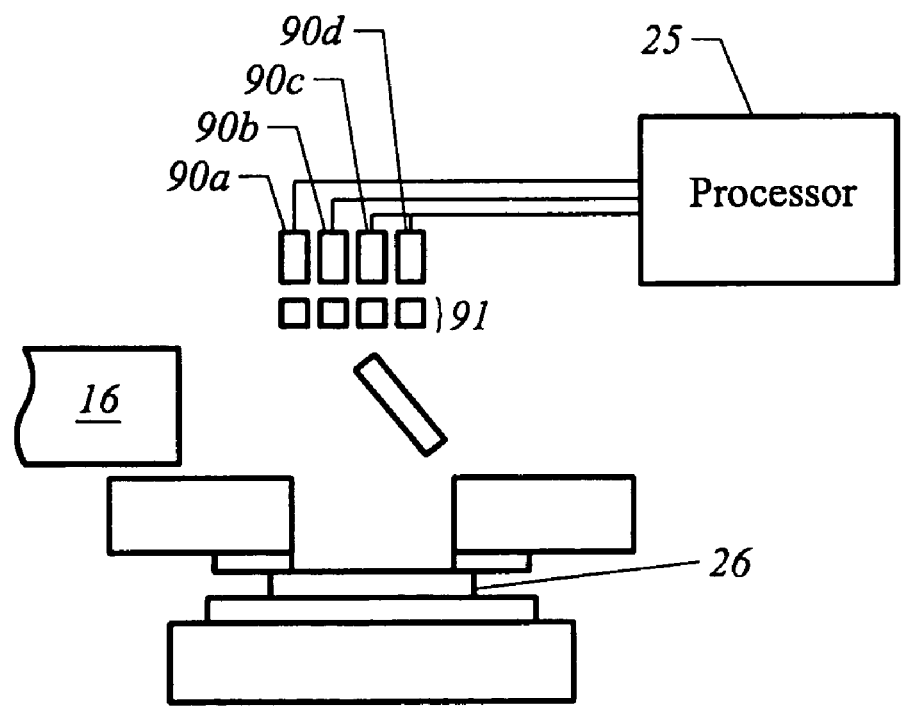
FIG. 11 is a simplified plan view of a lithographic system incorporating a detection system in accordance with a second embodiment of the present invention.

Referring to FIGS. 2, 7 and 11 in accordance with another embodiment of the present invention, detection system may include one or more photodiodes, four of which are shown as 90a, 90b, 90c and 90d may be included to facilitate endpoint detection. Photodiodes 90a, 90b, 90c and 90d include wave shaping optics 91 and are arranged to sense a predetermined portion of first substrate 26, such as 88a. However, it is advantageous to have photodiodes 90a, 90b, 90c and 90d sense portions 88b, 87a and 87b, as well. For ease of discussion however, photodiodes 90a, 90b, 90c and 90d are discussed with respect to region 88a, with the understanding that the present discussion applies equally to use of additional photodiodes to sense regions 87a, 87b and 88b.

To facilitate endpoint detections, photodiodes 90a, 90b, 90c and 90d are positioned to sense a portion of first substrate 26 that is located proximate to a periphery of imprinting layer 34 after "d" has reached a desired magnitude. As a result, photodiodes 90a, 90b, 90c and 90d may be employed as an endpoint detection system as discussed above with respect to CCD sensor 23 shown in FIG. 1. Referring again to FIGS. 2, 7 and 11, photodiodes 90a, 90b, 90c and 90d are in data communication with processor 25 to transmit information concerning portions 88a and 88b, such as intensity of light reflected from portions 88a and 88b. Specifically, portions 88a and 88b may be reflective, i.e., a mirror reflects ambient onto photodiodes 90a, 90b, 90c and 90d. Upon being covered by imprinting layer 34, the energy of light reflecting from portions 88a and 88b is substantially reduced, if not completely attenuated, thereby reducing the power of optical energy impinging upon photodiodes 90a, 90b, 90c and 90d. Photodiodes 90a, 90b, 90c and 90d produce a signal in response thereto that is interpreted by processor 25. In response, processor 25 operates to halt movement of imprint head 12, fixing the distance "d" between first substrate 26 and wafer 30. It should be understood that the detection system discussed with respect to photodiodes 90a, 90b, 90c and 90d may be used in conjunction with CCD sensor 23 and wave shaping optics 24, discussed with respect to FIG. 1. The advantage of employing photodiodes 90a, 90b, 90c and 90d is that data acquisition is faster than that provided by pixels of CCD sensor 23.

Figure 12:
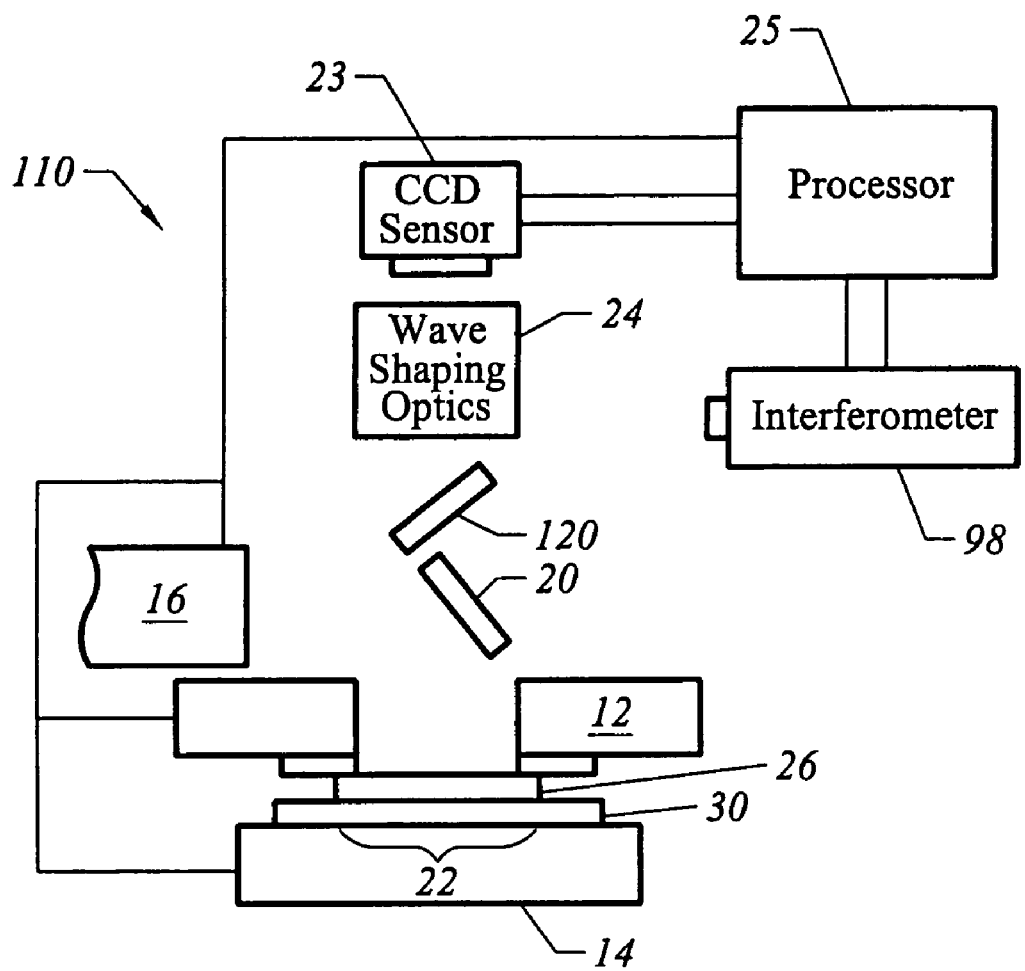
FIG. 12 is a simplified plan view of a lithographic system incorporating a detection system in accordance with a third embodiment of the present invention.

Referring to FIGS. 2, 11 and 12, another embodiment of the present invention is shown that facilitates determining characteristics of first substrate 26 and wafer 30 without knowing the volume associated with beads 36. To that end, the present embodiment of system 110 includes an interferometer 98 that may be used with the CCD sensor 23 the photodiodes 90a, 90b, 90c and 90d or a combination of both. As discussed above, system 110 includes wave shaping optics 24, radiation source 16, mirror 20 and imprint head 12. Imprint head 12 retains first substrate 26 disposed opposite wafer 30, with wafer 30 being supported by stage 14. Processor 25 is in data communication with imprint head 12, stage 14, radiation source 16, CCD sensor 23 and interferometer 98. Also disposed in an optical path of interferometer 98 is a 50—50 mirror 120 that enables a beam produced by interferometer 98 to be reflected onto region 22, while allowing CCD sensor 23 to sense region 22.

Use of interferometry facilitates determining distance "d" without having accurate information concerning the initial volume of beads 36. An exemplary interferometry system employed to measure distance "d" is described in U.S. patent application Ser. No. 10/210,894, entitled "Alignment Systems for Imprint Lithography", which in incorporated herein by reference.

Employing interferometer 98 facilitates concurrently determining the initial distance "d" and the change in distance Δd. From this information the volume associated with one or more beads 36 may be obtained. For example, interferometer 98 may be employed to obtain two measurements of first substrate 26 at two differing times $t_1$ and $t_2$ to obtain first substrate 26 displacement measurement $L_T$. During the same time, wafer 30 displacement measurement, $L_S$, may be obtained, in a similar manner. The change in distance, Δd, between first substrate 26 and wafer 30 is obtained as follows:

$$\Delta d = |L_T - L_S| \quad (4)$$

During times $t_1$ and $t_2$, measurements are taken with CCD sensor 23 to determine the change in area of one or more of beads 36 as a function of the total number of pixels in which one or more of beads 36 are sensed. At time $t_1$, the total number of pixels in which one or more beads 36 are sensed is $n_{p1}$. At time $t_2$, the total number of pixels in which one or more beads 36 are sensed is $n_{p2}$. From these two values the change in pixels, $\Delta n_p$, is defined as follows:

$$\Delta n_p = |n_{p2} - n_{p1}| \quad (5)$$

From equations 4 and 5 the value of distance "d" may be obtained from either of the following equations:

$$d_1 = (\Delta d / \Delta n_p) n_{p1} \quad (6)$$

$$d_2 = (\Delta d / \Delta n_p) n_{p2} \quad (7)$$

where $d = d_1 = d_2$. Knowing $d_1$ and $d_2$, by substitution we can obtain the volume V of the one or more beads 36 being sensed by CCD sensor 23 by either of the following equations:

$$V_1 = d_1(n_{p1} \times \text{pixelsize}) \quad (8)$$

$$V_2 = d_2(n_{p2} \times \text{pixelsize}) \quad (9)$$

where $V = V_1 = V_2$, and $(n_{p1} \times \text{pixelsize}) = (n_{p2} \times \text{pixelsize}) = A$. When first substrate 26 and wafer 30 may be maintained to be parallel, interferometer 98 may be measured outside of region 22, shown in FIG. 1. Otherwise, interferometer 98 measurements should be made proximate to a center of region 22, or expanding beads 36. In this manner, the substrate 26 characteristic information obtained using system 10, shown in FIG. 1, may be obtained employing system 110, shown in FIG. 12.

The embodiments of the present invention described above are exemplary. Many changes and modifications may be made to the disclosure recited above, while remaining within the scope of the invention. Therefore, the scope of the invention should be determined not with reference to the above description, but instead should be determined with reference to the appended claims along with their full scope of equivalents.

What is claimed is:

1. A system to determine system conditions by measuring characteristics of a volume of fluid disposed between a first substrate, lying in a first plane, and a second substrate, lying in a second plane, said system comprising:
 a displacement mechanism to cause relative movement between said volume and one of said first and second substrates to effectuate a change in area of said first and second substrates in superimposition with said volume;
 a detector system to sense said change in area and produce signals carrying information concerning said change in area;
 a memory containing a look-up table of data relating differing shapes of said volume to differing processing conditions; and
 a processing system, in data communication with said memory, to receive said signals and compare said information with said data and produce information corresponding to said system conditions.

2. The system as recited in claim 1 wherein said processing conditions include a relative angular position between said first and second substrate.

3. The system as recited in claim 1 wherein said processing conditions including a relative parallel orientation of said first and second planes.

4. The system as recited in claim 1 wherein said processing conditions further includes a presence of a defect in one of said first and second substrates.

5. The system as recited in claim 1 wherein said processing conditions further includes a presence of a defect in one of said first and second substrates and distinguishing between said first and second substrates as a source of said defect.

6. The system as recited in claim 1 wherein said processing conditions further includes a presence of a particulate contaminant on one of said first and second substrates.

7. The system as recited in claim 1 wherein said processing conditions further includes a presence of a particulate contaminant on one of said first and second substrates and distinguishing between said first and second substrates as a source of said particulate contaminant.

8. The system as recited in claim 1 wherein said processing conditions further includes a distance between said first and second substrates.

9. The system as recited in claim 1 wherein said processor determines said processing conditions in response to said change in areas measured during a period of time.

10. A system to determine processing conditions by measuring characteristics of a volume of imprinting material disposed between a first substrate, lying in a first plane, and a second substrate, lying in a second plane, said system comprising:
 a displacement mechanism to cause relative movement between said volume and one of said first and second substrates to effectuate a change in area of a portion of said first and second substrates in superimposition with said volume;
 a detector system to sense said change in area and produce signals carrying information concerning said change in area;
 a memory containing a look-up table of data relating differing shapes of said volume to differing processing conditions; and
 a processing system, in data communication with said memory, to receive said signals and compare said information with said data and determine one of said differing processing conditions associated therewith.

11. The system as recited in claim 10 wherein said processing conditions situations include a relative angular position between said first and second substrate.

12. The system as recited in claim 10 wherein said processing conditions including a relative parallel orientation of said first and second planes.

13. The system as recited in claim 10 wherein said processing conditions further includes a presence of a particulate contaminant on one of said first and second substrates.

14. The system as recited in claim 10 wherein said processing conditions further includes a presence of a particulate contaminant on one of said first and second substrates and distinguishing between said first and second substrates as a source of said particulate contaminant.

15. The system as recited in claim 10 wherein said processing conditions further includes a distance between said first and second substrates.

16. A system to determine processing conditions by measuring characteristics of a volume of imprinting material disposed between a first substrate, lying in a first plane, and a second substrate, lying in a second plane, said system comprising:
 a displacement mechanism to cause relative movement between said volume and one of said first and second substrates to effectuate a change in area of said first and second substrates in superimposition with said volume;

a detector system to sense said change in area and produce signals carrying information concerning said change in area;

a memory containing a look-up table of data relating differing shapes of said volume to differing processing conditions; and a processing system, in data communication with said memory, to receive said signals and compare said information with said data and determine one of said differing processing conditions associated therewith.

17. The system as recited in claim 16 wherein said processing condition is one of a set of conditions selected from a set consisting essentially of a relative angular position between said first and second substrates, a relative parallel orientation of said first and second planes, a presence of a particulate contaminant on one of said first and second substrates, and a distance between said first and second substrates.

18. The system as recited in claim 16 wherein said processing conditions further includes a presence of a defect in one of said displacement mechanism, said first substrate and said second substrate.

19. The system as recited in claim 16 wherein said processing conditions further includes a presence of a defect in one of said displacement mechanism, said first substrate and said second substrate and distinguishing between said displacement mechanism, said first substrate and said second substrates as a source of said defect.

* * * * *